(12) United States Patent
Seki et al.

(10) Patent No.: US 7,547,335 B2
(45) Date of Patent: Jun. 16, 2009

(54) METAL POLISHING COMPOSITION AND METHOD OF POLISHING USING THE SAME

(75) Inventors: Hiroyuki Seki, Shizuoka (JP); Katsuhiro Yamashita, Shizuoka (JP); Tomohiko Akatsuka, Shizuoka (JP); Tadashi Inaba, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 610 days.

(21) Appl. No.: 11/287,386

(22) Filed: Nov. 28, 2005

(65) Prior Publication Data

US 2006/0115973 A1 Jun. 1, 2006

(30) Foreign Application Priority Data

Nov. 26, 2004 (JP) ............... P.2004-342394
Mar. 14, 2005 (JP) ............... P.2005-071153

(51) Int. Cl.
*B24D 3/02* (2006.01)
*C09C 1/68* (2006.01)

(52) U.S. Cl. ............... 51/307; 438/600; 106/3

(58) Field of Classification Search ............ 51/307; 106/3
See application file for complete search history.

(56) References Cited

U.S. PATENT DOCUMENTS

| | | | | |
|---|---|---|---|---|
| 3,948,703 | A * | 4/1976 | Kushibe | 216/106 |
| 4,944,836 | A | 7/1990 | Bayer et al. | |
| 6,063,306 | A * | 5/2000 | Kaufman et al. | 252/79.4 |
| 6,191,086 | B1 * | 2/2001 | Leon et al. | 510/175 |
| 6,348,076 | B1 | 2/2002 | Canaperi et al. | |
| 6,802,983 | B2 * | 10/2004 | Mullee et al. | 210/749 |
| 2001/0011515 | A1 | 8/2001 | Aoki et al. | |
| 2001/0030366 | A1 | 10/2001 | Nakano et al. | |
| 2002/0160609 | A1 | 10/2002 | Katagiri et al. | |
| 2002/0187640 | A1 | 12/2002 | Wake | |
| 2003/0073386 | A1 | 4/2003 | Ma et al. | |
| 2003/0162684 | A1 * | 8/2003 | Huyhn et al. | 510/438 |
| 2004/0175942 | A1 | 9/2004 | Chang et al. | |
| 2004/0184867 | A1 * | 9/2004 | Wang et al. | 401/279 |
| 2005/0076579 | A1 * | 4/2005 | Siddiqui et al. | 51/307 |
| 2006/0154838 | A1 * | 7/2006 | Hayashida et al. | 510/175 |

FOREIGN PATENT DOCUMENTS

| | | |
|---|---|---|
| EP | 1 705 701 A2 | 9/2006 |
| JP | 49-122432 A | 11/1974 |
| JP | 2-278822 A | 11/1990 |
| JP | 2001-127019 A | 5/2001 |
| JP | 2001-279231 A | 10/2001 |
| JP | 2002-538284 A | 11/2002 |
| JP | 2003-507894 A | 2/2003 |
| JP | 2004/235317 A | 8/2004 |
| WO | WO 2004/063301 A1 | 7/2004 |
| WO | WO 2005/047409 A1 | 5/2005 |

OTHER PUBLICATIONS

European Search Report dated Feb. 23, 2007.

* cited by examiner

*Primary Examiner*—Michael A Marcheschi
*Assistant Examiner*—Pegah Parvini
(74) *Attorney, Agent, or Firm*—Sughrue Mion, PLLC

(57) ABSTRACT

A metal polishing composition comprising at least one of the compound represented by formula (1) defined herein and the compound represented by formula (2) defined herein, and an oxidizing agent, and a chemical mechanical polishing method comprising bringing the metal polishing composition into contact with a surface to be polished and providing a relative movement between the surface to be polished and a polishing surface.

6 Claims, No Drawings

METAL POLISHING COMPOSITION AND METHOD OF POLISHING USING THE SAME

FIELD OF THE INVENTION

The present invention relates to fabrication of semiconductor devices and more particularly a metal polishing composition used in the step of forming a wiring pattern of semiconductor devices and a polishing method using the composition.

BACKGROUND OF THE INVENTION

In the field of semiconductor devices exemplified by large scale integration circuits (hereinafter, LSI circuits), further development of microfine circuits and multilayer interconnection structures has ever been demanded in pursuit of higher integration and higher speed. Chemical mechanical polishing (hereinafter, CMP) is an enabling technology that has been used to achieve the purpose. CMP is a planarization process applied to a thin insulating film (e.g., $SiO_2$ film) or a thin wiring metal film to smooth a substrate or to remove an unwanted thin metal film to leave a wiring pattern as disclosed, e.g., in U.S. Pat. No. 4,944,836.

A metal polishing slurry used for CMP generally contains abrasive grains (e.g., alumina) and an oxidizing agent (e.g., hydrogen peroxide) The fundamental mechanism of CMP is considered to be that the oxidizing agent oxidizes the surface of metal to form an oxide film, which is removed by the abrasive grains as reported in *Journal of Electrochemical Society*, 1991, vol. 138, No. 11, pp 3460-3464.

However, CMP using such a polishing slurry containing solid abrasive grains can cause defects, such as scratches, thinning (excessive polishing all over the polished surface), dishing (thinning of the polished metal surface into a cavity), and erosion (excessive polishing of the dielectric between metal wires and dishing of the metal wires), CMP is usually followed by a cleaning step in which the polishing slurry remaining on the semiconductor is removed. The existence of the abrasive grains makes the post-CMP cleaning step complicated. Additionally, before the washing is disposed of as waste liquid, the solid grains should be separated by, for example, settlement, which incurs extra cost.

One of solutions to the problems is to use an abrasive-free polishing solution. *Journal of Electrochemical Society*, 2000, vol. 147, No. 10 pp 3907-3913 reports a metal polishing process using an abrasive-free polishing solution combined with a dry etching process. JP-A-2001-127019 discloses a metal polishing solution comprising hydrogen peroxide, malic acid, benzotriazole, ammonium polyacrylate, and water. According to these abrasiveless techniques, the projections of the metal film are selectively polished away while the depressions remaining filled with the metal film to provide a desired conductor pattern. Scratching is reduced because the friction with a polishing pad is far milder in the abrasiveless CMP than in the CHP using an abrasive-containing slurry.

Tungsten and aluminum have generally been used as wiring metals for interconnection structures. In pursuance of further heightened performance, LSI circuits using copper less resistant than tungsten or aluminum as a wiring metal have been developed. Among known copper wiring techniques is a damascene CMP process as taught, e.g., in JP-A-2-278822. A dual damascene process, in which trenches and vias are formed in an interlayer insulating film, and a wiring metal is deposited to simultaneously fill the trenches and the vias, has come into wide use. Copper of five or more nines purity has been used as a target material of copper deposition.

The tendency toward a still finer wiring pattern for higher density has boosted the demand for improvements on conductivity and electron characteristics of copper wires. To meet the demand, use of a copper alloy, i.e., high-purity copper doped with a third component has recently started to be studied. It has also been demanded to develop a high-speed metal polishing technique enabling high productivity and high precision without contaminating the high purity material.

A wafer size has been increasing to improve productivity in the fabrication of LSI circuits. Wafers of 200 mm or larger in diameter are now widely used, and manufacture of LSI circuits from 300 mm or larger wafers has been launched. Because the difference in polishing rate between the central and the peripheral portions of a wafer increases with a wafer size, there has been a keen demand for improved uniformity of planarization across a wafer.

JP-A-49-122432 proposes a method of chemically polishing copper or a copper alloy without using a mechanical polishing means. However, chemical polishing merely relying on dissolving action has planarity problems such as dishing more than CMP in which projections of the metal are selectively removed both chemically and mechanically.

JP-A-2001-279231 discloses an aqueous dispersion for CMP which can suppress deterioration of a polishing pad. The proposed technique is to reduce the level difference of the surface to be polished.

JP-T-2002-538284 (WO/0053691) discloses a working composition containing a chelating agent selected from iminodiacetic acid and its salts, which is used to modify the surface of wafers. JP-A-2003-507694 discloses a CMP composition containing an α-amino acid.

A polishing composition for Cu damascene CMP is required to have selectivity to copper over tantalum (hereinafter referred to as Cu/Ta selectivity),

SUMMARY OF THE INVENTION

The present invention has been made in the light of the above circumstances that further improvement on productivity of LSI circuit fabrication needs an increase of rate of polishing a wiring copper metal or copper alloy film in CMP.

An object of the present invention is to provide a metal polishing composition for CMP in the fabrication of LSI circuits, with which a high polishing rate and improved Cu/Ta selectivity can be achieved to provide improved planarity with minimized dishing.

As a result of extensive investigations into the above-described issues associated with metal polishing compositions, they have found that the object of the invention is accomplished by providing a metal polishing composition containing at least one of a compound represented by formula (1):

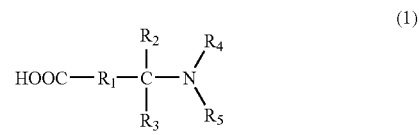

wherein $R_1$ represents a single bond, an alkylene group or a phenylene group; $R_2$ and $R_3$ each independently represent a hydrogen atom, a halogen atom, a carboxyl group, an alkyl group, a cycloalkyl group, an alkenyl group, an alkynyl group or an aryl group; and $R_4$ and $R_5$ each independently represent a hydrogen atom, a halogen atom, a carboxyl group, an alkyl group or an acyl group provided that when $R_1$ represents a single bond, $R_4$ and $R_5$ do not simultaneously represent a hydrogen atom; and a compound represented by formula (2):

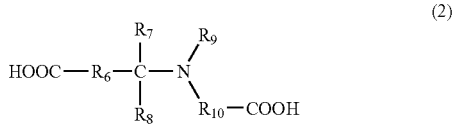

(2)

wherein $R_6$ represents a single bond, an alkylene group or a phenylene group; $R_7$ and $R_8$ each independently represent a hydrogen atom, a halogen atom, a carboxyl group, an alkyl group, a cycloalkyl group, an alkenyl group, an alkynyl group or an aryl group; $R_9$ represents a hydrogen atom, a halogen atom, a carboxyl group or an alkyl group; $R_{10}$ represents an alkylene group; with proviso that, when $R_{10}$ represents a methylene group, formula (2) satisfies at least one of a condition that $R_6$ is not a single bond and a condition that $R_9$ is not a hydrogen atom, and an oxidizing agent.

The present invention also provides preferred embodiments of the above-described metal polishing composition, wherein:

(1) the metal polishing composition contains both the compound of formula (1) and the compound of formula (2),
(2) the metal polishing composition further contains abrasive grains,
(3) the abrasive grains as referred to in (2) above are colloidal silica,
(4) the metal polishing composition further contains a compound having an aromatic ring,
(5) the compound having an aromatic ring as referred to in (4) above is a compound selected from a compound represented by formula (I);

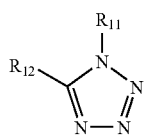

(I)

wherein $R_{11}$ and $R_{12}$ each independently represent a hydrogen atom or a substituent, or $R_{11}$ and $R_{12}$ are connected to each other to form a ring; when $R_{11}$ and $R_{12}$ both represent a hydrogen atom, the compound of formula (I) includes an enantiomer thereof, and a compound represented by formula (II):

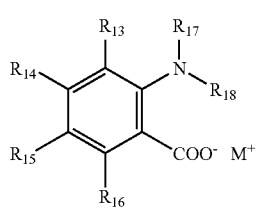

(II)

wherein $R_{13}$, $R_{14}$, $R_{15}$, $R_{16}$, $R_{17}$, and $R_{18}$ each independently represent a hydrogen atom or a substituent; any adjacent two of $R_{13}$, $R_{14}$, $R_{15}$, and $R_{16}$ may be connected to each other to form a ring; and $M^+$ represents a cation.

The present invention also provides a chemical mechanical polishing method including the steps of bringing the metal polishing composition according to the present invention into contact with a surface to be polished and providing a relative movement between the surface to be polished and a polishing surface.

Use of the metal polishing composition of the invention in a CMP process in the semiconductor fabrication offers the following advantages. An increased rate of CMP is achieved. Dishing is reduced, and planarity is improved. Improved Cu/Ta selectivity is obtained. Occurrence of CMP defects such as corrosion, scratches, thinning, and erosion due to local non-uniformity of polishing is minimized.

DETAILED DESCRIPTION OF THE INVENTION

In what follows, an atomic group includes a substituted one and an unsubstituted one unless otherwise specified. For example, "alkyl group", includes both an unsubstituted alkyl group and a substituted alkyl group.

The metal polishing composition (hereinafter simply referred to as a polishing composition) of the invention essentially contains an oxidizing agent and at least one organic acid selected from a compound represented by formula (1) (hereinafter simply referred to as a compound (1)) and a compound represented by formula (2) (hereinafter simply referred to as a compound (2)). The polishing composition is usually an aqueous solution. The metal polishing composition preferably contains a compound having an aromatic ring.

The polishing composition can further contain other components, preferably a surface active agent, a water soluble polymer, and an additive.

Each of the above-recited components constituting the polishing composition, whether essential or optional, may be a single kind or a combination of two or more kinds.

The terminology "(metal) polishing composition" as used herein is intended to include not only a polishing composition having a solute concentration adjusted for actual use (e.g., a concentrate diluted with water or an aqueous solution described infra) but a concentrate. The polishing composition having a concentration adjusted for actual use will hereinafter be simply referred to as a "polishing composition for use". The term "concentrate" or "high concentration polishing composition" is intended to denote a polishing composition having a higher solute concentration than for actual use and therefore needs dilution with water or an aqueous solution (described infra) before use. The dilution ratio is usually 1 to 20 by volume. Note that the term "concentrate" or "high concentration composition" as used in the present invention may be equivalent to "thick liquid" in a way apart from a physical operation of concentration such as evaporation or removal of a solvent.

In formula (1) representing the compound used in the polishing composition of the present invention, the alkylene group as $R_1$ may be straight-chain, branched or cyclic and preferably contains 1 to 8 carbon atoms, including methylene and ethylene. Substituents the alkylene group can have include a hydroxy group and a halogen atom.

The alkyl group as $R_2$ and $R_3$ preferably contains 1 to 8 carbon atoms and includes methyl and propyl.

The cycloalkyl group as $R_2$ and $R_3$ preferably contains 5 to 15 carbon atoms and includes cyclopentyl, cyclohexyl, and cyclooctyl.

The alkenyl group as $R_2$ and $R_3$ preferably contains 2 to 9 carbon atoms and includes vinyl, propenyl, and allyl.

The alkynyl group as $R_2$ and $R_3$ preferably contains 2 to 9 carbon atoms and includes ethynyl, propynyl, and butynyl, The aryl group as $R_2$ and $R_3$ preferably contains 6 to 15 carbon atoms and includes phenyl.

The alkylene group in these groups may have a hetero atom such as oxygen or sulfur in their chain structure.

Substituents the group as $R_2$ or $R_3$ may have include a hydroxyl group, a halogen atom, an aromatic group (preferably containing 3 to 15 carbon atoms), a carboxyl group, and an amino group.

The alkyl group as $R_4$ and $R_5$ preferably contains 1 to 8 carbon atoms and includes methyl and ethyl.

The acyl group as $R_4$ and $R_5$ preferably contains 2 to 9 carbon atoms and includes methylcarbonyl.

Substituents the group as $R_4$ or $R_5$ may have include a hydroxyl group, an amino group, and a halogen atom.

In formula (1), it is preferred for $R_4$ and $R_5$ not to represent a hydrogen atom simultaneously.

Of the compounds (1) preferred are those in which $R_1$ is a single bond, and both $R_2$ and $R_4$ are a hydrogen atom. In these preferred compounds, $R_3$ preferably represents a hydrogen atom or an alkyl group, and $R_5$ preferably represents an alkyl group. Substituents the alkyl group as $R_3$ can have preferably include a hydroxyl group, a carboxyl group, and an amino group, and substituents the alkyl group as $R_5$ an have preferably include a hydroxyl group and an amino group.

In formula (2), the alkylene group as $R_6$ and $R_{10}$ may be straight-chain, branched or cyclic and preferably contains 1 to 8 carbon atoms, including methylene and ethylene.

Substituents that the alkylene group and the phenylene group may have include a hydroxyl group and a halogen atom.

The alkyl group as $R_7$ and $R_8$ preferably contains 1 to 8 carbon atoms and includes methyl and propyl.

The cycloalkyl group as $R_7$ and $R_8$ preferably contains 5 to 15 carbon atoms and includes cyclopentyl, cyclohexyl, and cyclocotyl.

The alkenyl group as $R_7$ and $R_8$ preferably contains 2 to 9 carbon atoms and includes vinyl, propenyl, and allyl.

The alkynyl group as $R_7$ and $R_8$ preferably contains 2 to 9 carbon atoms and includes ethynyl, propynyl, and butynyl.

The aryl group as $R_7$ and $R_8$ preferably contains 6 to 15 carbon atoms and includes phenyl.

The alkylene group in these groups may have a hetero atom such as oxygen or sulfur in its chain.

Substituents the group as $R_7$ or $R_8$ may have include a hydroxyl group, a halogen atom, and an aromatic ring (preferably containing 3 to 15 carbon atoms).

The alkyl group as $R_9$ preferably contains 1 to 8 carbon atoms and includes methyl and ethyl.

The acyl group as $R_9$ preferably contains 2 to 9 carbon atoms and includes methylcarbonyl.

The alkylene group in these groups may have a hetero atom such as oxygen or sulfur in its chain.

Substituents the group as $R_9$ may have include a hydroxyl group, an amino group, a halogen atom, and a carboxyl group.

Of the compounds (2), preferred are those in which $R_9$ is not a hydrogen atom.

Specific examples of the compounds represented by formula (1) or (2) are shown below for illustrative purposes but not for limitation.

TABLE 1

$$\text{HOOC} - R_1 - \underset{\underset{R_3}{|}}{\overset{\overset{R_2}{|}}{C}} - \underset{R_5}{\overset{R_4}{N}} \quad (1)$$

| | $R_1$ | $R_2$ | $R_3$ | $R_4$ | $R_5$ |
|---|---|---|---|---|---|
| A-1 | — | —H | —H | —H | —CH$_3$ |
| A-2 | — | —H | —H | —H | —CH$_2$OH |
| A-3 | — | —H | —H | —CH$_2$OH | —CH$_2$OH |
| A-4 | — | —H | —H | —H | —CH$_2$CH$_2$OH |
| A-5 | — | —H | —H | —CH$_2$CH$_2$OH | —CH$_2$CH$_2$OH |
| A-6 | — | —H | —CH$_3$ | —H | —CH$_2$OH |
| A-7 | — | —H | —CH$_3$ | —CH$_2$CH$_2$OH | —CH$_2$CH$_2$OH |
| A-8 | — | —H | —CH$_2$OH | —H | —CH$_2$OH |
| A-9 | — | —H | —CH(CH$_3$)$_2$ | —CH$_2$OH | —CH$_2$OH |
| A-10 | — | —H | —Ph | —H | —(CH$_2$CH$_2$O)$_2$H |
| A-11 | — | —H | —CH$_2$-(imidazole) | —CH$_2$CH$_2$OH | —CH$_2$CH$_2$OH |
| A-12 | — | —H | —CH$_2$SCH$_3$ | —CH$_2$CH$_2$OH | —CH$_2$CH$_2$OH |
| A-13 | — | —H | —H | —H | —COCH$_2$NH$_2$ |
| A-14 | — | —H | —CH$_2$OH | —H | —COCH$_2$NH$_2$ |
| A-15 | — | —H | —H | —H | —COCH$_3$ |
| A-16 | —CH$_2$— | —H | —H | —CH$_2$CH$_2$OH | —CH$_2$CH$_2$OH |
| A-17 | —CH$_2$— | —H | —H | —H | —CH$_2$OH |
| A-18 | —CH$_2$— | —H | —H | —H | —COCH$_2$NH$_2$ |
| A-19 | —CH$_2$CH$_2$— | —H | —H | —H | —H |
| A-20 | — | —H | —CH$_3$ | —H | —CH$_2$CH$_2$OH |
| A-21 | — | —H | —CH$_3$ | —H | —CH$_2$OH |

TABLE 1-continued $$\text{HOOC}-R_1-\underset{\underset{R_3}{|}}{\overset{\overset{R_2}{|}}{C}}-\underset{R_5}{\overset{R_4}{N}} \qquad (1)$$

|      | $R_1$ | $R_2$ | $R_3$         | $R_4$ | $R_5$          |
|------|-------|-------|---------------|-------|----------------|
| A-22 | —     | —H    | —CH$_2$CH$_3$ | —H    | —CH$_2$CH$_2$OH |
| A-23 | —     | —H    | —CH$_3$       | —H    | —CH$_2$OH      |
| A-24 | —     | —H    | —CH$_3$       | —H    | —CH$_2$CH$_2$NH$_2$ |
| A-25 | —     | —H    | —CH(CH$_3$)$_2$ | —H  | —CH$_2$CH$_2$OH |
| A-26 | —     | —H    | Phenyl group  | —H    | —CH$_2$CH$_2$OH |
| A-27 | —     | —H    | —H            | —H    | —(CH$_2$)$_3$OH |

TABLE 2

$$\text{HOOC}-R_6-\underset{\underset{R_8}{|}}{\overset{\overset{R_7}{|}}{C}}-\underset{R_{10}-\text{COOH}}{\overset{R_9}{N}} \qquad (2)$$

|      | $R_6$   | $R_7$ | $R_8$    | $R_9$            | $R_{10}$        |
|------|---------|-------|----------|------------------|-----------------|
| B-1  | —       | —H    | —H       | —CH$_2$          | —CH$_2$—        |
| B-2  | —       | —H    | —H       | —CH$_2$OH        | —CH$_2$—        |
| B-3  | —       | —H    | —H       | —CH$_2$CH$_2$OH  | —CH$_2$—        |
| B-4  | —       | —H    | —H       | —(CH$_2$CH$_2$O)$_{10}$H | —CH$_2$— |
| B-5  | —       | —H    | —CH$_3$  | —                | $\underset{-\text{CH}-}{\overset{\text{CH}_3}{|}}$ |
| B-6  | —       | —H    | —CH$_2$OH| —H               | $\underset{-\text{CH}-}{\overset{\text{CH}_2\text{OH}}{|}}$ |
| B-7  | —CH$_2$—| —H    | —H       | —H               | —CH$_2$—        |
| B-8  | —CH$_2$—| —H    | —H       | —H               | —CH$_2$CH$_2$—  |
| B-9  | —CH$_2$—| —H    | —H       | —CH$_2$CH$_2$OH  | —CH$_2$CH$_2$—  |
| B-10 | —CH$_2$—| —H    | —H       | —CH$_2$COOH      | —CH$_2$—        |
| B-11 | —       | —H    | —CH$_3$  | —H               | —CH$_2$CH$_2$—  |

The compounds (1) and (2) can be either synthesized by known processes or purchased from the market.

The compounds (1) and (2) are used preferably in a total amount of 0.0005 to 5 mol, still preferably 0.01 to 0.5 mol, per liter of the polishing composition for use.

It is preferred to use both the compound (1) and the compound (2). The weight ratio of the compound (1) to compound (2) is usually 100/1 to 1/100, preferably 10/1 to 1/10.

The polishing composition of the invention contains an oxidizing agent that oxidizes a metal to be polished. Useful oxidizing agents include hydrogen peroxide, peroxides, nitrates, iodates, periodates, hypochlorites, chlorites, chlorates, perchlorates, persulfates, dichromates, permanganates, ozone water, silver (II) salts, and iron (III) salts. Examples of preferred iron (III) salts include inorganic ones, such as iron (III) nitrate, iron (III) chloride, iron (III) sulfate, and iron (III) bromide, and organic complex salts.

Examples of complex-forming organic compounds providing organic complex salts of iron (III) are acetic acid, citric acid, oxalic acid, salicylic acid, diethyldithiocarbamic acid, succinic acid, tartaric acid, glycolic acid; glycine, alanine, aspartic acid, thioglycolic acid, ethylenediamine, trimethylenediamine, diethylene glycol, triethylene glycol, 1,2-ethanedithiol, malonic acid, glutaric acid, 3-hydroxybutyric acid, propionic acid, phthalic acid, isophthalic acid, 3-hydroxysalicylic acid, 3,5-dihydroxysalicylic acid, gallic acid, benzoic acid, maleic acid, salts of the above acids, and aminopolycarboxylic acids and their salts.

Examples of the aminopolycarboxylic acids are ethylenediamine-N,N,N',N'-tetraacetic acid, diethylenetriaminepentaacatic acid, 1,3-diaminopropane-N,N,N',N'-tetraacetic acid, 1,2-diaminopropane-N,N,N',N'-tetraacetic acid, ethylenediamine-N,N'-disuccinic acid (racemate), ethylenediaminedisuccinic acid (SS-form), N-(2-carboxylatoethyl)-L-aspartic acid; N-(carboxymethyl)-L-aspartic acid, β-alaninediacetic acid, methyliminodiacetic acid, nitrilotriacetic acid, cyclohexanediaminetetraacetic acid, iminodiacetic acid, glycol ether diaminetetraacetic acid, ethylenediamine-N,N'-diacetic acid, ethylenediamine orthohydroxyphenylacetic acid, and N,N-bis(2-hydroxybenzyl)ethylenediamine-N,N-diacetic acid. The salts of the aminopolycarboxylic acids preferably include alkali metal salts and ammonium salts, with ammonium salts being particularly preferred.

Of the recited oxidizing agents preferred are hydrogen peroxide, iodates, hypochlorites, chlorates, and organic complex salts of iron (III). Preferred complex forming compounds providing organic complex salts of iron (II) include citric acid, tartaric acid, and aminopolycarboxylic acids (e.g., ethylenediamine-N,N,N',N'-tetraacetic acid, diethylenetriaminepentaacetic acid, 1,3-diaminopropane-N,N,N',N'-tetraacetic acid, ethylenediamine-N,N'-disuccinic acid (racemate), ethylenediaminedisuccinic acid (SS-form), N-(2-carboxylatoethyl)-L-aspartic acid, N-(carboxymethyl)-L-aspartic acid, β-alaninediacetic acid, methyliminodiacetic acid, nitrilotriacetic acid, and iminodiacetic acid).

Still preferred oxidizing agents are hydrogen peroxide and an iron (III) complex salt with ethylenediamine-N,N,N',N'-tetraacetic acid, 1,3-diaminopropane-N,N,N',N'-tetraacetic acid or ethylenediaminedisuccinic acid (SS-form).

The concentration of the oxidizing agent in the polishing composition for use is preferably 0.003 mol/l or higher to sufficiently oxidize the metal to be polished thereby to achieve a high CMP rate and is preferably 8 mol/l or lower from the standpoint of preventing the polishing surface from getting rough. The concentration is more preferably 0.03 to 6 mol/l, even more preferably 0.1 to 4 mol/l.

The polishing composition preferably contains a compound having an aromatic ring, such as a benzene ring or a naphthalene ring. The compound having an aromatic ring preferably has a molecular weight of 20 to 600. The compound having an aromatic ring includes tetrazoles and derivatives thereof, anthranylic acids and derivatives thereof, aminotoluic acid, quinaldic acid, and the following azoles.

The azoles as a compound having an aromatic ring include benzimidazole-2-thiol, 2-[2-(benzothiazolyl)]thiopropionic acid, 2-[2-(benzothiazolyl)]thiobutyric acid, 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxy-1H-benzotriazole, 4-methoxycarbonyl-1H-benzotriazole, 4-butoxycarbonyl-1H-benzotriazole, 4-octyloxycarbonyl-1H-benzotriazole, 5-hexylbenzotriazole, N-(1,2,3-benzotriazolyl-1-methyl)-N-(1,2,4-triazolyl-1-methyl)-2-ethylhexylamine, tolyltriazole, naphthotriazole, and bis[(1-benzotriazolyl)methyl]phosphonic acid. Of these azole compounds preferred are benzotriazole, 4-hydroxybenzotriazole, 4-carboxy-1H-benzotriazole butyl ester, tolyltriazole, and naphthotriazole for obtaining both a high CMP rate and a low etching rate.

It is particularly preferred for the polishing composition to contain at least one compound having an aromatic ring selected form tetrazoles and derivatives thereof and anthranylic acids and derivatives thereof.

The tetrazoles and derivatives thereof preferably include compounds represented by formula (I):

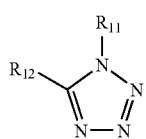

(I)

wherein $R_{11}$ and $R_{12}$ each independently represent a hydrogen atom or a substituent, or $R_{11}$ and $R_{12}$ are connected to each other to form a ring; when $R_{11}$ and $R_{12}$ both represent a hydrogen atom, the compound of formula (I) includes an enantiomer thereof.

The anthranylic acids and derivatives thereof preferably include compounds represented by formula (II):

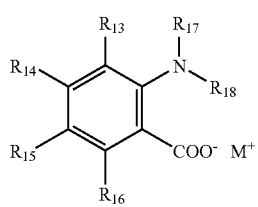

(II)

wherein $R_{13}$, $R_{14}$, $R_{15}$, $R_{16}$, $R_{17}$, and $R_{18}$ each independently represent a hydrogen atom or a substituent, any adjacent two of $R_{31}$, $R_{14}$, $R_{15}$ and $R_{16}$ may be connected to each other to form a ring; and $M^+$ represents a cation.

The substituents as $R_{11}$ and $R_{12}$ include, but are not limited to, a halogen atom (e.g., fluorine, chlorine, bromine or iodine), an alkyl group (a straight-chain, branched or cyclic (including polycyclic, like bicycloalkyl) alkyl group which may contain an active methine group), an alkenyl group, an alkynyl group, an aryl group, a heterocyclic group (bondable at its any position), an acyl group, an alkoxycarbonyl group, an aryloxycarbonyl group, a heterocyclic oxycarbonyl group, a carbamoyl group (examples of a substituted carbamoyl group including N-hydroxycarbamoyl, N-acylcarbamoyl, N-sulfonylcarbamoyl, N-carbamoylcarbamoyl, thiocarbamoyl, and N-sulfamoylcarbamoyl), a carbazoyl group, a carboxyl group or a salt thereof, an oxalyl group, an oxamoyl group, a cyano group, a carbonimidoyl group, a formyl group, a hydroxyl group, an alkoxy group (inclusive of one having recurring ethyleneoxy or propyleneoxy units), an aryloxy group, a heterocyclic oxy group, an acyloxy group, an alkoxy- or aryloxycarbonyloxy group, a carbamoyloxy group, a sulfonyloxy group, an amino group, an alkylamino group, an arylamino group, a heterocyclic amino group, an acylamino group, a sulfonamide group, a ureido group, a thioureido group, an N-hydroxyureido group, an imido group, an alkoxycarbonylamino group, an aryloxycarbonylamino group, a sulfamoylamino group, a semicarbazide group, a thiosemicarbazide group, a hydrazino group, an ammonio group, an oxamoylamino group, an N-(alkyl or aryl)sulfonylureido group, an N-acylureido group, an N-acylsulfamoylamino group, a hydroxyamino group, a nitrilo group, a quaternarized nitrogen-containing heterocyclic group (e.g., pyridinio, imidazolio, quinolinio or isoquinolinio), an isocyano group, an imino group, a mercapto group, an alkyl-, aryl- or heterocyclic thio group, an alkyl-, aryl- or heterocyclic dithio group, an alkyl- or arylsulfonyl group, an alkyl- or arylsulfinyl group, a sulfo group or a salt thereof, a sulfamoyl group (examples of a substituted sulfamoyl group including N-acylsulfamoyl and N-sulfonylsulfamoyl) or a salt thereof, a phosphino group, a phosphinyl group, a phosphinyloxy group, a phosphinylamino group, and a silyl group.

The term "active methine group" denotes a methine group substituted with two electron-withdrawing groups. The electron withdrawing groups include an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group, and a carbonimidoyl group. The two electron withdrawing groups may be connected to each other to form a cyclic structure. The term "salt" as used above denotes salt forms with inorganic cations such as alkali metal ions, alkaline earth metal ions, and heavy metal ions and organic cations such as ammonium and phosphonium ions.

Preferred of the substituents recited above are a halogen atom (e.g., fluorine, chlorine, bromine or iodine), an alkyl group (a straight-chain, branched or cyclic (including polycyclic, like bicycloalkyl) alkyl group which may contain an active methine group), an alkenyl group, an alkynyl group, an aryl group, a heterocyclic group (bondable at its any position), an acyl group, an alkoxycarbonyl group, an aryloxycarbonyl group, a heterocyclic oxycarbonyl group, an unsubstituted carbamoyl group, an N-hydroxycarbamoyl group, an N-acylcarbamoyl group, an N-sulfonylcarbamoyl group, an N-carbamoylcarbamoyl group, a thiocarbamoyl group, an N-sulfamoylcarbamoyl group, a carbazoyl group, an oxalyl group, an oxamoyl group, a cyano group, a carbonimidoyl group, a formyl group, a hydroxyl group, an alkoxy group (inclusive of one having recurring ethyleneoxy or propyleneoxy units), an aryloxy group, a heterocyclic oxy group, an acyloxy group, an alkoxy- or aryloxycarbonyloxy group, a carbamoyloxy group, a sulfonyloxy group, an alkylamino group, an arylamino group, a heterocyclic amino group, an acylamino group, a sulfonamide group, a ureido group, a thioureido group, an N-hydroxyureido group, an imido group, an alkoxy- or aryloxycarbonyl amino group, a sulfamoylamino group, a semicarbazide group, a thiosemicarbazide group, a hydrazino group, an ammonio group, an oxamoylamino group, an N-(alkyl or aryl) sulfonylureido group, an N-acylureido group, an N-acylsulfamoylamino group, a hydroxyamino group, a nitrilo group, a quaternarized nitrogen-containing heterocyclic group (e.g., pyridinio, imidazolio, quinolinio or isoquinolinio), an isocyano group, an imino group, a mercapto group, an alkyl-, aryl- or heterocyclic thio group, an alkyl-, aryl- or heterocyclic dithio group, an alkyl- or arylsulfonyl group, an alkyl- or arylsulfinyl group, a sulfo group or a salt thereof, an unsubstituted sulfamoyl group, an N-acylsulfamoyl group, an N-sulfonylsulfamoyl group or a salt thereof, a phosphino group, a phosphinyl group, a phosphinyloxy group, a phosphinylamino group, and a silyl group. The term "active methine group" denotes a methine group substituted with two electron withdrawing groups. The electron withdrawing groups include an acyl group, an alkoxycarbonyl group, an aryloxycarbonyl group a carbamoyl group, an alkylsulfonyl group, an arylsulfonyl group, a sulfamoyl group, a trifluoromethyl group, a cyano group, a nitro group, and a carbonimidoyl group.

Still preferred substituents are a halogen atom (e.g., fluorine, chlorine, bromine or iodine), an alkyl group (a straight-chain, branched or cyclic (including polycyclic, like bicycloalkyl) alkyl group which may contain an active methine group), an alkenyl group, an alkynyl group, an aryl group, and a heterocyclic group (bondable at its any position).

The ring formed of $R_{11}$, $R_{12}$, and the —C—N— bond in formula (I) may be monocyclic or polycyclic and is preferably a 5- or 6-membered monocyclic ring or a polycyclic ring composed of 5- or 6-membered rings.

The substituents recited above as $R_{11}$ and $R_{12}$ may further have a substituent.

The compound (I) preferably has a molecular weight of 20 to 600, still preferably 40 to 400.

Specific but non-limiting examples of the compound (I) are shown below.

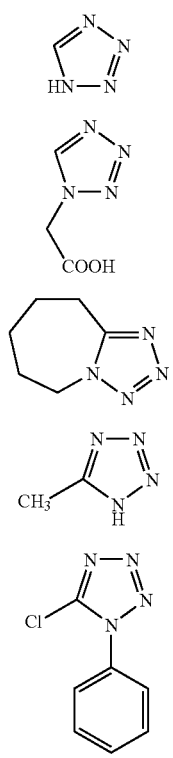

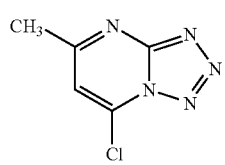

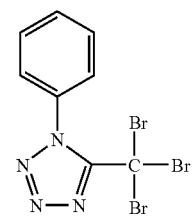

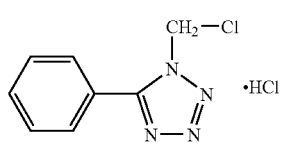

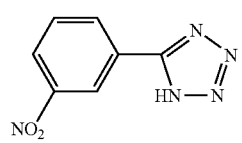

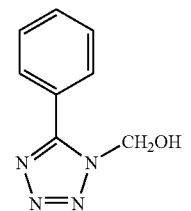

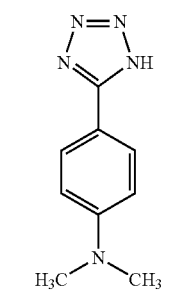

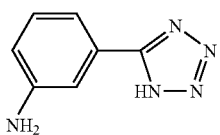

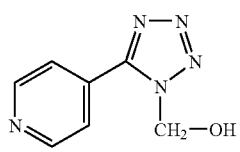

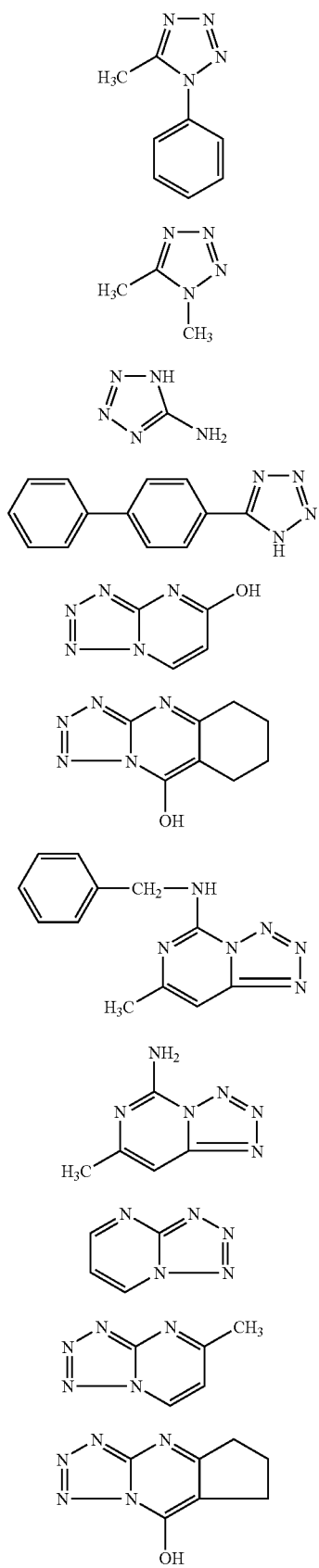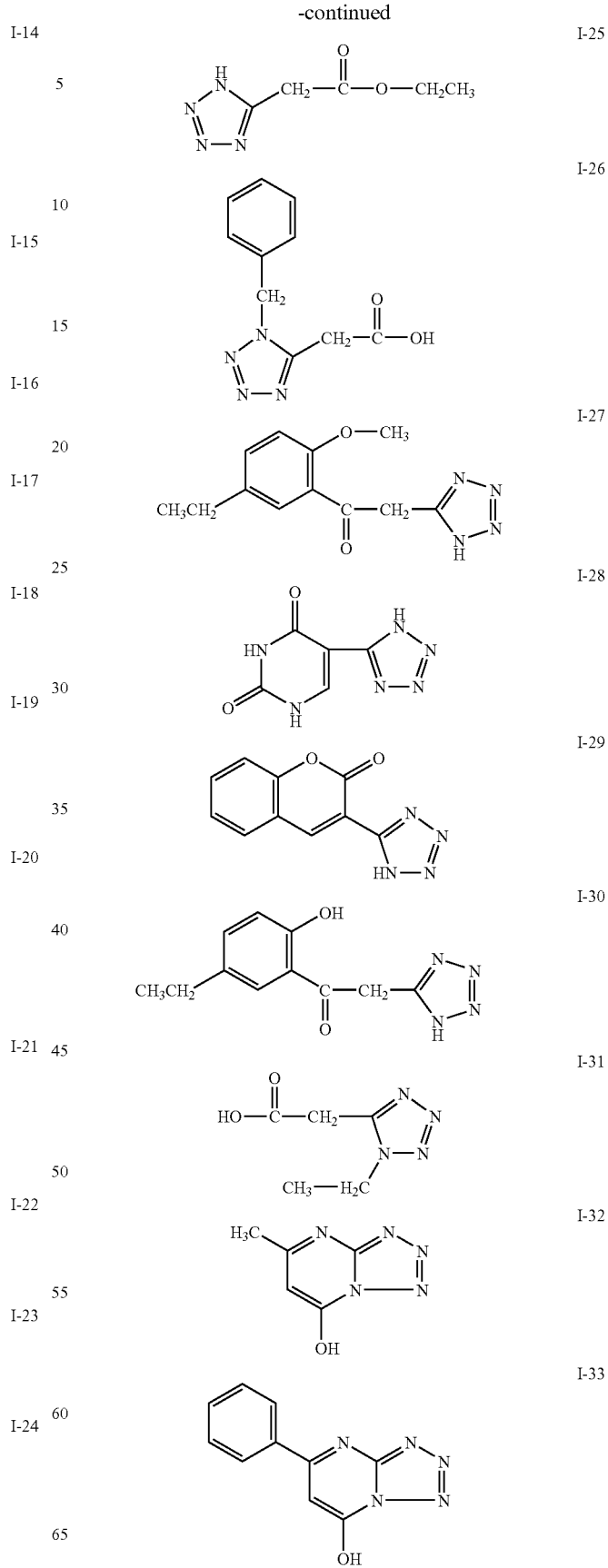

-continued

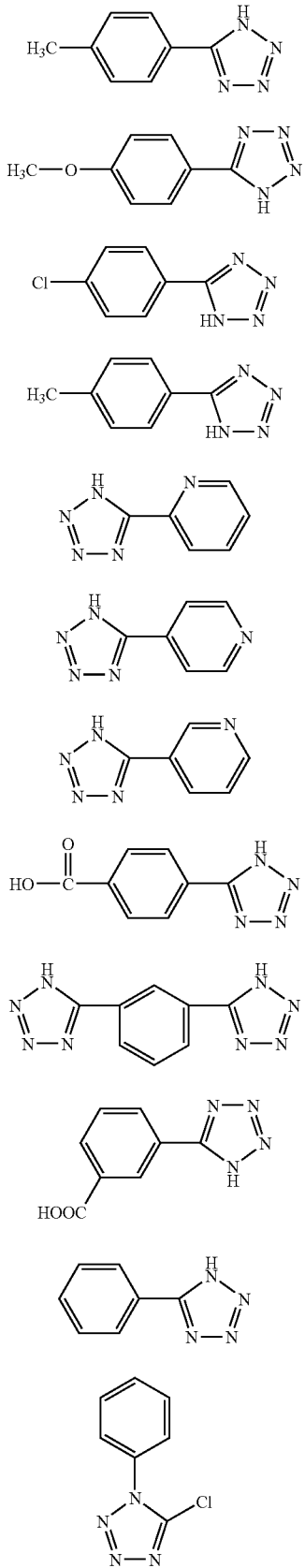

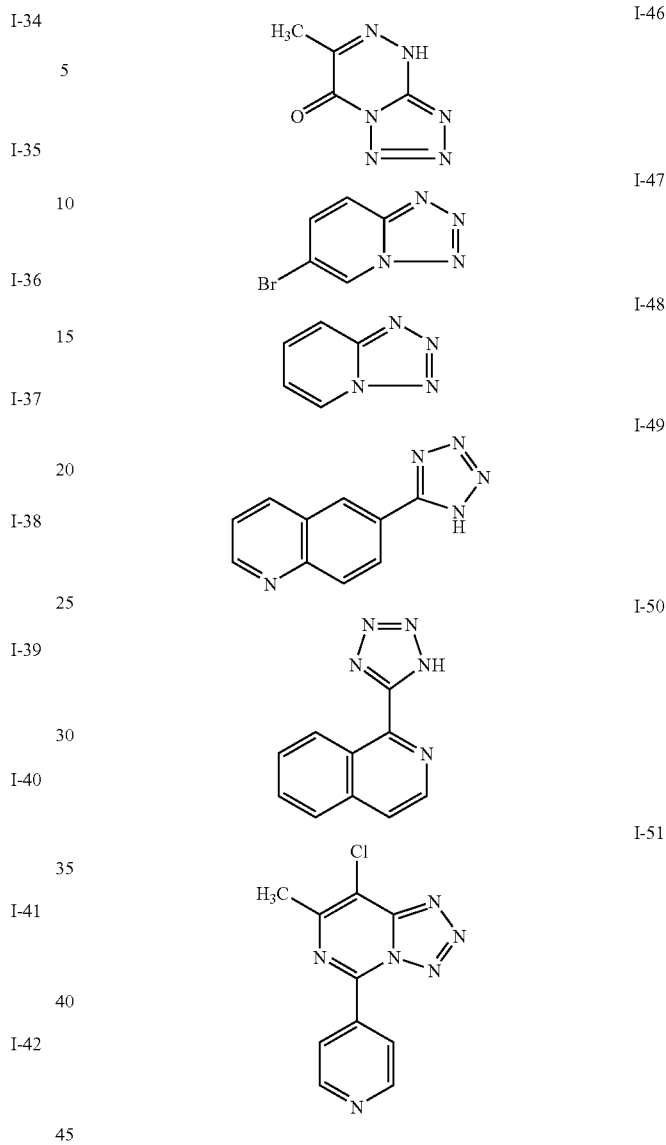

Preferred of the compounds (I) shown above are compounds I-1, I-3, I-4, I-10, I-15, I-21, I-22, I-23, I-41, and I-48. Still preferred are compounds I-1, I-4, I-15, I-22, and I-23.

The compounds (I) can be used either individually or as a combination of two or more thereof.

The compounds (I) can be synthesized by known processes or purchased from the market.

The substituents as $R_{13}$, $R_{14}$, $R_{15}$, $R_{16}$, $R_{17}$, and $R_{18}$ in formula (II) include, but are not limited to, a halogen atom (e.g., fluorine, chlorine, bromine or iodine), an alkyl group (a straight-chain, branched or cyclic (including polycyclic, like bicycloalkyl) alkyl group which may contain an active methine group), an alkenyl group, an alkynyl group, an aryl group, a heterocyclic group (bondable at its any position), an acyl group, an alkoxycarbonyl group, an aryloxycarbonyl group, a heterocyclic oxycarbonyl group, a carbamoyl group (examples of a substituted carbamoyl group including N-hydroxycarbamoyl, N-acylcarbamoyl, N-sulfonylcarbamoyl, N-carbamoylcarbamoyl, thiocarbamoyl, and N-sulfamoylcarbamoyl), a carbazoyl group, a carboxyl group or a salt thereof, an oxalyl group, an oxamoyl group, a cyano group, a carbonimidoyl group, a formyl group, a hydroxyl group, an alkoxy group (inclusive of one having recurring ethyleneoxy or propyleneoxy units), an aryloxy group, a heterocyclic oxy group, an acyloxy group, an alkoxy- or aryloxycarbonyloxy group, a carbamoyloxy group, a sulfonyloxy group, an amino group, an alkylamino group, an arylamino group, a heterocyclic amino group, an acylamino group, a sulfonamide group, a ureido group, a thioureido group, an N-hydroxyureido group, an imido group, an alkoxycarbonylamino group, an aryloxycarbonylamino group, a sulfamoylamino group, a semicarbazide group, a thiosemicarbazide group, a hydrazino group, an ammonio group, an oxamoylamino group, an N-(alkyl or aryl)sulfonylureido group, an N-acylureido group, an N-acylsulfamoylamino group, a hydroxyamino group, a nitrilo group, a quaternarized nitrogen-containing heterocyclic group (e.g., pyridinio, imidazolio, quinolinio or isoquinolinio), an isocyano group, an imino group, a mercapto group, an alkyl-, aryl- or heterocyclic thio group, an alkyl-, aryl- or heterocyclic dithio group, an alkyl- or arylsulfonyl group, an alkyl- or arylsulfinyl group, a sulfo group or a salt thereof, a sulfamoyl group (examples of a substituted sulfamoyl group including N-acylsulfamoyl and N-sulfonylsulfamoyl) or a salt thereof, a phosphino group, a phosphinyl group, a phosphinyloxy group, a phosphinylamino group, and a silyl group.

The term "active methine group" denotes a methine group substituted with two electron withdrawing groups. The electron withdrawing groups include an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group, and a carbonimidoyl group. The two electron withdrawing group may be connected to each other to form a cyclic structure. The term "salt" as used herein denotes salt forms with inorganic cations such as alkali metal ions, alkaline earth metal ions, and heavy metal ions and organic cations such as ammonium and phosphonium ions.

The substituents recited above as $R_{13}$ to $R_{18}$ may further have a substituent.

Of the compounds (II) preferred are those in which at least one of $R_{13}$, $R_{14}$, $R_{15}$, and $R_{16}$ represents a substituent other than an unsubstituted alkyl group. Still preferred are those in which $R_{17}$ and $R_{18}$ each represent a hydrogen atom. Particularly preferred are those in which at least one of $R_{13}$, $R_{14}$, $R_{15}$, and $R_{16}$ represents the above-described electron withdrawing group, and $R_{17}$ and $R_{18}$ each represent a hydrogen atom.

The cation $M^+$ includes, but is not limited to, a hydrogen ion, an alkali metal ion (e.g., $Na^+$, $K^+$ or $Li^+$), and an ammonium ion (e.g., $NH_4^+$ or quaternary ammonium ion).

The compound (II) preferably has a molecular weight of 20 to 600, still preferably 40 to 400.

Specific but non-limiting examples of the compound (II) are shown below.

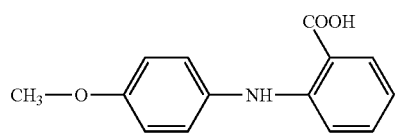
II-1

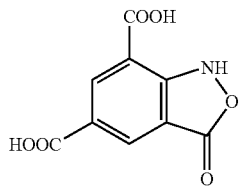
II-2

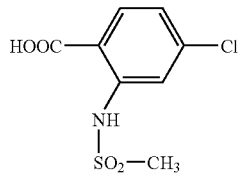
II-3

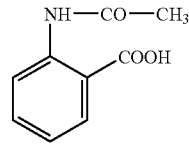
II-4

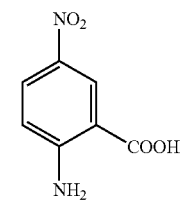
II-5

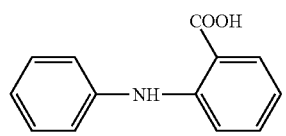
II-6

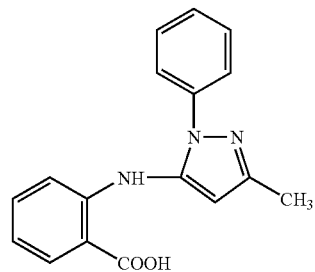
II-7

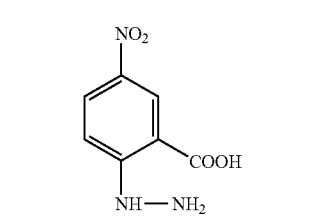
II-8

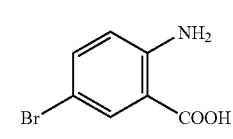
II-9

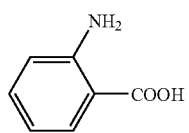
II-10

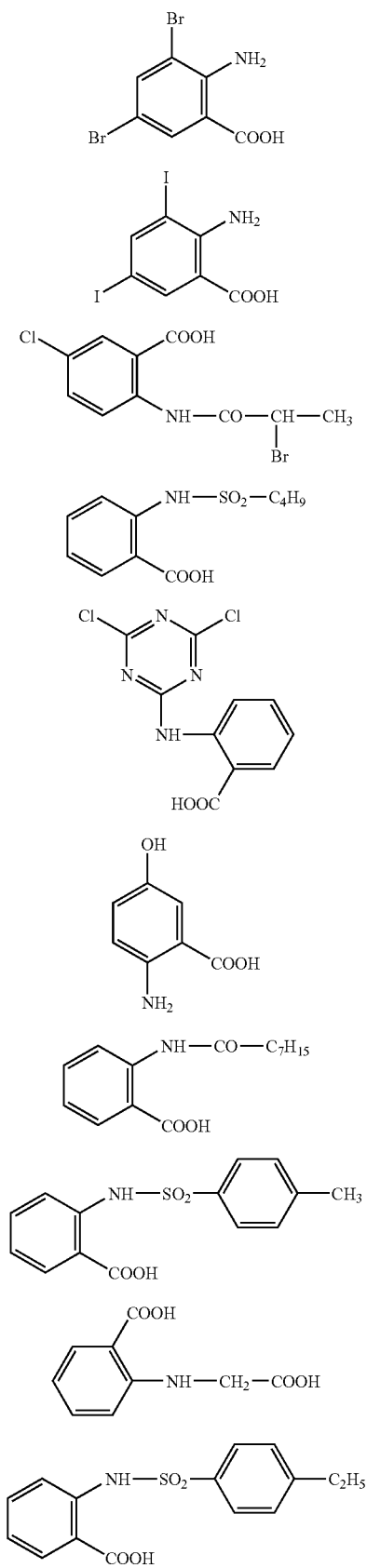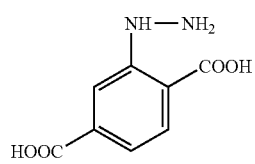

II-30 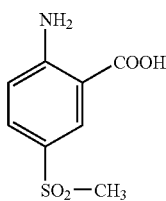

II-31 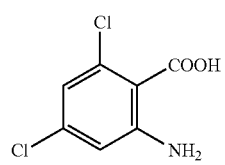

II-32 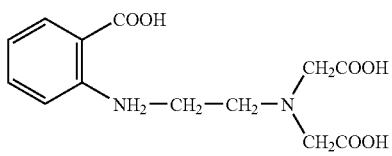

II-33 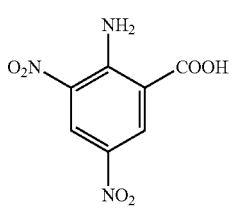

II-34 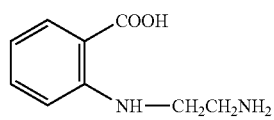

II-35 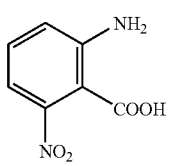

II-36 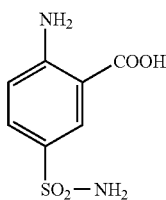

II-37 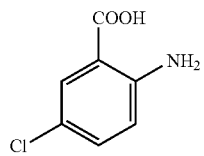

II-38 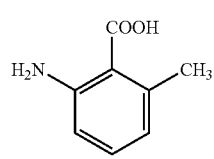

II-39 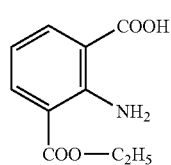

Preferred of the above compounds are compounds II-2, II-5, II-9, II-27, II-29, II-30, II-33, II-35, and II-37. Still preferred are II-5, II-9, II-27, II-29, and II-33.

Also included in useful compounds (II) are the compounds shown above in which the hydrogen atom of the carboxyl group is displaced with an alkali metal ion (e.g., $Na^+$, $K^+$ or $Li^+$) or an ammonium ion (e.g., $NH_4^+$ or quaternary ammonium ion).

The compounds (II) can be used either individually or as a combination of two or more thereof.

The compound (II) can be synthesized by known processes or purchases from the market. For instance, compound II-29 can be synthesized by the process reported in *Synthesis*, (8), 654-659 (1983), and compound II-37 can be synthesized by the processes described in *Tetrahedron Letters*, 51(7), 1861-1866 (1995), ibid, 44 (25), 4741-4745 (2003). The other compounds are also obtainable in accordance with the processes disclosed in these publications.

The compound or compounds having an aromatic ring selected form tetrazoles and derivatives thereof and anthranylic acids and derivatives thereof can be added preferably in a total concentration of 0.0001 to 1.0 mol, still preferably 0.001 to 0.5 mol, even still preferably 0.01 to 0.1 mol, per liter of the polishing composition for use. Concentrations of 0.0001 mol/l or higher are preferred for producing sufficient effects. Concentrations of 1.0 mol/l or lower are preferred for preventing the oxidizing agent and the compound having an aromatic ring from deteriorating (no effect or decomposition).

The polishing composition can additionally contain a thiocyanate, a thioether, a thiosulfate or a mesoionic compound in combination in a concentration lower than the total concentration of the compounds having an aromatic ring selected form tetrazoles and derivatives thereof and anthranylic acids and derivatives thereof.

The polishing composition may optionally contain an acid. The "acid" as an optional component is a compound structurally different from the metal oxidizing agent, and the acids functioning as an oxidizing agent and the organic acid compounds of formulae (1) and (2) axe excluded from that term. The acid as referred to here serves for oxidation acceleration, pH adjustment, and buffering.

The acid so defined includes inorganic acids, organic acids, and amino acids. The inorganic acids include sulfuric acid, nitric acid, boric acid, and phosphoric acid. Phosphoric acid is a preferred inorganic acid. In the present invention, the presence of an organic acid or an amino acid, especially an amino acid is preferred.

The organic acid is preferably water soluble. Suitable acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, and their salts (e.g., ammonium salts and alkali metal salts), and mixtures thereof. Among them, formic acid, malonic acid, malic acid, tartaric acid and citric acid are suited to a laminate structure having a layer of at least one metal selected from copper, a copper alloy, a copper oxide, and a copper alloy oxide.

The amino acid is preferably water soluble. Suitable amino acids include glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diodo-L-tyrosine, β-(3,4-dihydroxyphenyl-L-alanine, L-thyroxine, 4-hydroxy-L-proline, L-cysteine, L-methionine, L-ethionine, L-lanthionine, L-cystathionine, L-cystine, L-cysteic acid, L-aspartic acid, L-glutamic acid, S-(carboxymethyl)-L-cysteine, 4-aminobutyric acid, L-asparagine, L-glutamine, azaserine, L-alginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamine, angiotensin I, angiotensin II, and antipain.

Particularly preferred of the above-described acids are malic acid, tartaric acid, citric acid, glycine, and glycolic acid because they effectively control the rate of etching while maintaining a practical CMP rate.

The acid is added preferably in a concentration of not more than 0.5 mol per liter of the polishing composition for use to suppress etching and of at least 0.0005 mol/l to produce sufficient effects. The acid concentration is still preferably 0.005 to 0.3 mol/l, even still preferably 0.01 to 0.1 mol/l.

According to need, the polishing composition preferably contains a chelating agent (i.e., a water softener) to lessen the adverse influences of polyvalent metal ions that may be incorporated into the composition. General-purpose water softeners, which inhibit precipitation of calcium and magnesium ions and their analogs are used as a chelating agent. Examples include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, transcyclohexanediaminetetraacetic acid, 1,2-diaminopropanetetraacetic acid, glycol ether diaminetetraacetic acid, ethylenediamine orthohydroxyphenylacetic acid, ethylenediaminedisuccinic acid (SS-form), N-(2-carboxylatoethyl)-L-aspartic acid, β-alaninediacetic acid, 2-phosphonobutane-1,2,4-tricarboxylic acid, 1-hydroxyethylidene-1,1-diphosphonic acid, N,N'-bis (2-hydroxybenzyl) ethylenediamine-N,N'-diacetic acid, and 1,2-dihydroxybenzene-4,6-disulfonic acid.

Two or more of the chelating agents may be used in combination. The chelating agent is added in a concentration enough to inactivate metal ions (such as polyvalent metal ions) that have been incorporated into the polishing composition. For example, the chelating agent is added in a concentration of 0.0003 to 0.07 mol per liter of the polishing composition for use.

The polishing composition can contain the following additives ammonia; amines, such as alkylamines (e.g., dimethylamine, trimethylamine, triethylamine, and propylenediamine), ethylenediaminetetraacetic acid, sodium diethyldithiocarbamate, and chitosan; imines, such as dithizone, cuproine (2,2'-biquinoline), neocuproine (2,9-dimethyl-1,10-phenanthroline), vasocuproine (2,9-dimethyl-4,7-diphenyl-1,10-phenanthroline), and cuperazone (biscyclohexanone oxalylhydrazone); and mercaptans, such as nonyl mercaptan, dodecyl mercaptan, triazine thiol, triazine dithiol, and triazine trithiol. Preferred of them are chitosan, ethylenediaminetetraacetic acid, L-tryptophane, cuperazone, and triazine dithiol for achieving both a high CMP rate and a low etching rate.

The additive is added preferably in a concentration of at least 0.0001 mol per liter of the polishing composition for use to suppress etching and of not more than 0.5 mol/l to prevent reduction in CMP rate. The additive concentration is still preferably 0.001 to 0.2 mol/l, even still preferably 0,005 to 0.1 mol/l.

The polishing composition preferably contains a surface active agent and/or a hydrophilic polymer. A surface active agent and a hydrophilic polymer both have an action to reduce the contact angle of a surface to be polished thereby helping polish uniformly. The surface active agent and/or the hydrophilic polymer to be used is suitably selected from the following.

Useful anionic surface active agents include carboxylates, sulfonates, sulfuric ester salts, and phosphoric ester salts. Examples of the carboxylates are soaps, N-acylamino acid salts, polyoxyethylene or polyoxypropylene alkyl ether carboxylates, and acylated peptides. Examples of the sulfonates are alkylsulfonates, alkylbenzenesulfonates, alkylnaphthalenesulfonates, sulfosuccinates, α-olefinsulfonates, and N-acylsulfonates. Examples of the sulfuric ester salts are sulfated oils, alkylsulfates, alkyl ether sulfates, polyoxyethylene or polyoxypropylene alkyl allyl ether sulfates, and alkylamide sulfates. Examples of the phosphoric ester salts are alkylphosphates and polyoxyethylene or polyoxypropylene alkyl allyl ether phosphates.

Useful cationic surface active agents include aliphatic aminos, aliphatic quaternary ammonium salts, benzalkonium chloride, benzethonium chloride, pyridinium salts, and imidazolinium salts.

Useful amphoteric surface active agents include carboxybetaines, aminocarboxylates, imidazolinium betaine, lecithin, and alkylamine oxides.

Useful nonionic surface active agents include ethers, ether esters, esters, and nitrogen-containing compounds. Examples of ether type ones are polyoxyethylene alkyl ethers, polyoxyethylene alkyl phenyl ethers, alkylallyl-formaldehyde condensed polyoxyethylene ethers, polyoxyethylene polyoxypropylene block copolymers, and polyoxyethylene polyoxypropylene alkyl ethers. Examples of ether ester type ones are polyoxyethylene ethers of glycerol esters, polyoxyethylene ethers of sorbitan esters, and polyoxyethylene ethers of sorbitol esters. Examples of ester type ones are polyethylene glycol fatty acid esters, glycol esters, polyglycerol esters, sorbitan esters, propylene glycol esters, and sucrose esters. Examples of nitrogen-containing type ones are fatty acid alkanolamides, polyoxyethylene fatty acid amides, and polyoxyethylene alkylamides.

Fluorine-containing surface active agents are also employable.

Other useful surface active agents, hydrophilic compounds, and hydrophilic polymers include esters, such as glycerol asters, sorbitan esters, ethyl methoxyacetate, ethyl ethoxyacetate, ethyl 3-ethoxypropionate, and alanine ethyl ester; ethers, such as polyethylene glycol, polypropylene glycol, polytetramethylene glycol, polyethylene glycol alkyl ethers, polyethylene glycol alkenyl ethers, alkyl polyethylene glycols, alkyl polyethylene glycol alkyl ethers, alkyl polyethylene glycol alkenyl ethers, alkenyl polyethylene glycols, alkenyl polyethylene glycol alkyl ethers, alkenyl polyethylene glycol alkenyl ethers, polypropylene glycol alkyl ethers, polypropylene glycol alkenyl ethers, alkyl polypropylene glycols, alkyl polypropylene glycol alkyl ethers, alkyl polypropylene glycol alkenyl ethers, alkenyl polypropylene glycols, alkenyl polypropylene glycol alkyl ethers, and alkenyl polypropylene glycol alkenyl ethers; polysaccharides, such as alginic acid, pectic acid, carboxymethyl cellulose, curdlan, and pullulan; amino acid salts, such as an ammonium or sodium salt of glycine; polycarboxylic acids and salts thereof, such as polyaspartic acid, polyglutamic acid, polylysine, polymalic acid, polymethacrylic acid, ammonium polymethacrylate, sodium polymethacrylate, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamic acid, ammonium polyamate, sodium polyamate, and polyglyoxylic acid; vinyl polymers, such as polyvinyl alcohol, polyvinylpyrrolidone, and polyacrolein; sulfonic acids and their salts, such as ammonium methyl taurate, sodium methyl taurate, sodium methyl sulfate, ammonium ethyl sulfate, ammonium butyl sulfate, sodium vinylsulfonate, sodium 1-allylsulfonate, sodium 2-allylsulfonate, sodium methoxymethylsulfonate, ammonium ethoxymethylsulfonate, sodium 3-ethoxypropylsulfonate, and sodium sulfosuccinate; and amides, such as propionamide, acrylamide, methylurea, nicotinamide, succinamide, and sulfanylamide.

In the case where the substrate is a silicon wafer for semiconductor integrated circuits, use of an acid or an ammonium salt thereof is recommended to avoid contamination with an alkali metal, an alkaline earth metal, a halide, etc. This is not the case when the substrate is glass, etc. Of the above recited compounds preferred are cyclohexanol, ammonium polyacrylate, polyvinyl alcohol, succinamide, polyvinylpyrrolidone, polyethylene glycol, and polyoxyethylene polyoxypropylene block copolymers.

The total amount of the surface active agent and/or the hydrophilic polymer is preferably 0.001 g or higher per liter of the polishing composition for use to bring about sufficient effects and 10 g/l or lower to minimize reduction in CMP rate. The total amount is still preferably 0.01 to 5 g/l, even still preferably 0.1 to 3 g/l. The surface active agent and/or the hydrophilic polymer preferably have a weight average molecular weight of 500 to 100000, more preferably 2000 to 50000.

If necessary, the polishing composition may contain an alkali agent for pH adjustment and a buffer for pH variation control.

Useful alkali agents and buffers include nonmetallic alkali agents, such as ammonium hydroxide, organic ammonium hydroxides (e.g., tetramethylammonium hydroxide), and alkanolamines (e.g., diethanolamine, triethanolamine, and triisopropanolamine); alkali metal hydroxides (e.g., sodium hydroxide, potassium hydroxide, and lithium hydroxide), carbonates, phosphates, borates, tetraborates, hydroxybenzoates, glycyl salts, N,N-dimethylglycine salts, leucine salts, norleucine salts, guanine salts, 3,4-dihydroxyphenylalanine salts, alanine salts, aminobutyric acid salts, 2-amino-2-methyl-1,3-propanediol salts, valine salts, proline salts, trishydroxyaminomethane salts, and lysine salts.

Examples of the alkali agents and buffers are sodium hydroxide, potassium hydroxide, lithium hydroxide, sodium carbonate, potassium carbonate, sodium hydrogencarbonate, potassium hydrogencarbonate, trisodium phosphate, tripotassium phosphate, disodium phosphate, dipotassium phosphate, sodium borate, potassium borate, sodium tetraborate (borax), potassium tetraborate, sodium o-hydroxybenzoate (sodium salicylate), potassium o-hydroxybenzoate, sodium 5-sulfo-2-hydroxybenzoate (sodium 5-sulfosalicylate), potassium 5-sulfo-2-hydroxybenzoate (potassium 5-sulfosalicylate), and ammonium hydroxide. Preferred of them are ammonium hydroxide, potassium hydroxide, lithium hydroxide, and tetramethylammonium hydroxide.

The alkali agent and the buffer are used in an amount enough to maintain the pH within a suitable range, preferably 0.0001 to 1.0 mol, still preferably 0.003 to 0.5 mol, per liter of the polishing composition for use.

The pH of the polishing composition for use is preferably 2 to 14, still preferably 3 to 12, even still preferably 3.5 to 8. The polishing composition of the present invention exhibits especially excellent effects at a pH within the recited preferred range.

The kinds and amounts of the compounds to be used in the polishing composition and the pH of the polishing composition are decided as appropriate taking into consideration adsorptivity to the polishing surface, reactivity to the surface to be polished, solubility of the metal to be polished, electrochemical properties of the surface to be polished, the state of dissociation of functional groups of the compounds, the composition stability, and so forth.

In preparing the polishing composition concentrate, which is to be diluted on use, it is preferred that those components whose water solubility at room temperature is less than 5% be used in an amount within double, still preferably within 1.5 times, the water solubility at room temperature so as to prevent them from precipitating when the concentrate is cooled to 5° C.

The polishing composition of the invention preferably contains abrasive grains. Preferred materials of the abrasive grains include silica (including precipitated silica, fumed silica, colloidal silica, and synthetic silica), ceria, alumina, titania, zirconia, germania, manganese oxide, silicon carbide, polystyrene, polyacrylate, and polyterephthalate, with colloidal silica being particularly preferred.

The abrasive grains preferably have an average particle size of 5 to 1000 nm, still preferably 10 to 200 nm.

The abrasive grains are preferably used in an amount of 0.01% or more based on the total weight of the polishing composition for use to obtain sufficient effects in improving the polishing rate and reducing variations in polishing rate across a wafer and of 20% by weight or less on the same basis because the CMP rate is saturated at the amount of 20%. The amount of the abrasive grains is still preferably 0.05% to 5% by weight.

It has been found that when the polishing composition contains no or less than 0.01% by weight of abrasive grains, adjusting the pH of the composition to 3.5 or higher, preferably 4.0 or higher, brings about an improved polishing rate and reduced dishing. In this case, it is preferred to add the above-described hydrophilic polymer, such as polyacrylic acid, to the composition in a concentration of 0.0001% to 5%, preferably 0.01% to 0.5%, by weight.

In the present invention the semiconductor to be polished is preferably an LSI circuit having a copper and/or copper alloy wire, particularly a copper alloy wire, especially a copper-silver alloy wire. A preferred silver content of the copper-silver alloy is up to 40% by weight, still preferably up to 10% by weight, particularly preferably up to 1% by weight. The polishing composition of the invention achieves its full effects when applied to a copper alloy having a silver content of 0.00001% to 0.1% by weight.

The LSI circuit to be polished preferably has a wire thickness of, in terms of half pitch, 0.15 µm or smaller, still preferably 0.10 µm or smaller, even still preferably 0.08 µm or smaller, for DRAM devices and 0.12 µm or smaller, still preferably 0.09 µm or smaller, even still preferably 0.07 µm or smaller, for MPU devices. The polishing composition of the present invention is especially effective in the manufacture of these LSI circuits.

It is preferred for the semiconductor substrate to be polished to have a barrier layer between the copper and/or copper alloy wire layer and the interlayer insulating film to prevent copper diffusion. Low resistivity metallic materials, such as TiN, TiW, Ta, TaN, W, and WN, are used as a barrier layer. A Ta or TaN layer is particularly preferred.

A polishing composition is supplied as (1) a concentrate, which requires dilution with water on use to prepare a polishing composition for use, (2) two or more aqueous solutions (hereinafter described), which are mixed up and, where needed, diluted with water into a polishing composition for use, or (3) a polishing composition for use, which can be use as such. The polishing method according to the present invention is effective with any of these forms of polishing compositions. The polishing method of the invention is carried out by feeding the polishing composition of the invention onto a polishing pad on a turntable, bringing a surface to be polished into contact with the polishing pad, and providing a relative movement between the surface to be polished and the polishing pad.

To carry out metal polishing with the polishing composition of the invention, a commonly employed polishing apparatus can be used, which has a holder holding a substrate having a surface to be polished and a turntable with a polishing pad mounted thereon. The turntable is equipped with a motor, etc. capable of changing the rotational speed of the turntable. The polishing pad is not particularly limited and includes nonwoven fabric, foamed polyurethane, and porous fluoropolymers. Polishing conditions are not limited. The rotational speed of the turntable is preferably 200 rpm or lower so as not to throw off the substrate. The downforce of the semiconductor substrate (having a surface (film) to be polished) against the polishing pad preferably ranges from 5 to 500 $g/cm^2$. To satisfy both the uniformity of polishing rate across a wafer and the planarity of the circuit pattern, the downforce is still preferably 12 to 240 $g/cm^2$.

During the CMP process, the polishing composition is continuously fed onto the polishing pad by means of a pump, etc. The feed rate of the polishing composition is not limited but is preferably sufficient to always cover the surface of the polishing pad. After completion of the CMP process, the semiconductor substrate is thoroughly cleaned with running water, and water droplets are removed by a spin dryer. The substrate is then dried.

Where a high concentration composition is diluted with a diluting aqueous solution to prepare a polishing composition for use, the diluting aqueous solution is water containing at least one of the oxidizing agent, the acid, the additive, and the surface active agent in an amount(s) that will give a desired composition as a polishing composition for use when mixed with the high concentration composition. According to this manner, it is possible to increase the concentration of the high concentration composition because a less soluble component may be supplied in the form of a separate aqueous solution and be mixed into the high concentration composition upon use.

The high concentration polishing composition (concentrate) can be diluted with water or the above-described aqueous solution by joining a pipe feeding the concentrate and a pipe feeding water or the aqueous solution and feeding the mixed composition, i.e., a polishing composition for use, to the polishing pad. Mixing the two compositions is accomplished by commonly practiced means, for example, by passing the compositions through a narrow passageway under pressure to strike the compositions against each other, or passing the compositions through a pipe packed with fillers such as glass tubes thereby repeatedly dividing the fluid into flows and jointing the flows together, or providing the pipe with power-driven blades.

The polishing composition is preferably fed at a rate of 10 to 1000 ml/min. To satisfy both the uniformity of polishing rate across a wafer and the planarity of the circuit pattern, the feeding rate is still preferably 170 to 800 ml/min.

The concentrate and water or the aqueous solution may be fed onto the polishing pad through the respective pipes at the respective predetermined feeding rates and mixed up there by the relative movement between the polishing pad and the surface to be polished. Otherwise, the concentrate and water or the aqueous solution may be mixed up in a container at a predetermined mixing ratio before being fed to the polishing pad.

Polishing may also be carried out as follows. The components constituting the polishing composition are divided into at least two parts. Each part is diluted with water or an aqueous solution and supplied to the polishing pad on the turntable. The polishing pad and the surface to be polished are brought into contact with each other, and a relative movement is provided between the pad and the surface to be polished.

For example, the constituent components are divided into part A containing an oxidizing agent and part B containing an acid, an additive, a surface active agent, and water. Upon use, each of part A and part B is diluted with water or an aqueous solution.

In another example, additives having low solubility are divided into two groups. The constituent components are divided into part A containing an oxidizing agent, one of the groups of the additive(s), and a surface active agent and part B containing an acid, the other group of the additives, a surface active agent, and water. Upon use, each of parts A and B is diluted with water or an aqueous solution. In this case, three pipes are required; a first one for part A, a second one for part B, and a third one for water or the aqueous solution. Dilution and mixing can be conducted by, for example, joining the three pipes into one feed pipe, in which the three parts are mixed into a polishing composition for use. Two out of the three pipes may be joined into one, which is then joined with the third one.

Where a divided part contains an additive that is hard to dissolve is mixed with the other divided part, the route through which the divided parts are mixed can be extended to secure the time for dissolving before being joined with the pipe of water or an aqueous solution. As stated above, the three pipes may be led directly to the polishing pad so that the three parts may be mixed by the relative movement between the polishing pad and the surface to be polished. Otherwise, the three parts may previously be mixed up in a container, from which the prepared polishing composition is fed to the polishing pad.

It is a preferred manipulation to raise the temperature of a certain part to increase the solubility of a component that dissolves less easily. For example, part A containing an oxidizing agent is maintained at 40° C. or lower, and part B containing the other components is heated between room temperature and 100° C. When part A is mixed with part B or diluted with water or an aqueous solution for use, the mixture is cooled to 40° C. or lower.

When the part B that does not contain the oxidizing agent and has been heated between room temperature and 100° C. is cooled down, the once dissolved component precipitates. Therefore, the part having the precipitated component should be re-heated to re-dissolve the component before use. This can be achieved by using means for delivering the part (composition) having been heated to have the component dissolved and means for agitating the composition containing the precipitated component and forwarding the agitated composition through a heated pipe through which the component is re-dissolved. If the temperature of the part A containing the oxidizing agent rises above 40° C. when mixed with the heated part B, there is a fear that the oxidizing agent decomposes. To avoid this, the temperatures of the heated part B and the part A containing the oxidizing agent and serving to cool the part B should be controlled so that the temperature of the resulting mixed composition may not exceed 40° C.

As previously described, the components constituting the polishing composition may be divided into two or more parts which are supplied directly to the polishing surface. In this case, the components are preferably divided into at least two parts, one containing an oxidizing agent and the other containing an acid. It is also possible that a concentrate and diluting water are separately supplied to the polishing surface.

The polishing pad that can be used in the present invention includes nonfoamed pads and foamed pads. The nonfoamed pads are hard synthetic resin bulk materials such as plastic plates. The foamed pads include closed cell structures (dry process foams), open call structures (wet process foams), and double layer laminate structures, with the double layer laminate structures being preferred. The foam may be either uniform or non-uniform.

The polishing pad may contain abrasive grains for polishing, such as ceria, silica, alumina, and resins. The abrasive grains include soft ones and hard ones, both of which are usable. When the polishing pad having the double layer laminate structure contains abrasive grains, it is preferred that the abrasive grains in different layers have different hardnesses.

Preferred materials of the polishing pad include artificial leather, polyamide, polyurethane, polyester, and polycarbonate. The polishing pad may have grooves (lattice, concentric or spiral) or holes formed on its polishing surface.

The wafer which is subjected to CMP process using the polishing composition of the present invention preferably has a diameter of 200 nm or greater, still preferably 300 nm or greater. The present invention offers noticeable advantages when applied to wafers of 300 nm or greater in diameter.

EXAMPLES

The present invention will now be illustrated in greater detail with reference to Examples, but it should be noted that the invention is not limited thereto.

Synthesis Example 1

Synthesis of A-5

To 1 liter of a 0.5 mol/l aqueous solution of N,N-dihydroxyethylamine was added 0.75 mol of iodoacetic acid, and the mixture was stirred at 70° C. for 24 hours to prepare A-5.

Synthesis Example 2

Synthesis of A-4

To 1 liter of a 0.5 mol/l aqueous solution of N,N-dihydroxyethylamine was added 0.75 mol of chloroacetic acid, and the mixture was stirred at 70° C. for 24 hours to prepare A-4.

Synthesis Example 3

Synthesis of A-2

To 1 liter of a 0.2 mol/l aqueous glycine solution were added 2 mol of formalin and triethylamine, and the mixture was stirred at 40° C. for 6 hours to prepare A-2.

Synthesis Example 4

Synthesis of B-2

To 1 liter of a 0.5 mol/l aqueous solution of iminodiacetic acid were added 2 mol of formalin and triethylamine, and the mixture was stirred at 60° C. for 6 hours to prepare B-2.

The other compounds used in Examples were prepared in the same manner as in the foregoing Synthesis Examples.

Example 1

A polishing composition was prepared according to the following formulation and evaluated by a polishing test.

Formulation:

| | |
|---|---|
| Hydrogen peroxide (oxidizing agent) | 5 g/l |
| A-1 (organic acid, available from Wako Pure Chemical Industries, Ltd.) | 6 g/l |
| Benzotriazole (compound having aromatic ring) | 0.5 g/l |
| Colloidal silica (abrasive grains) | 10 g/l |
| Pure water to make | 1000 ml |
| pH (adjusted with aqueous ammonia and sulfuric acid) | 6.8 |

Test Conditions:
  Polishing pad: IC1-400 XY-K Groove (from Rodel Inc.)
  CMP equipment: LGP 612 (from Lapmaster SFT Corp.)
  Downforce: 100 g/cm$^2$
  Polishing composition feed rate: 200 ml/min
  Cu blanket wafer: 200 mm diameter wafer coated with 1.4 μm thick copper film
  Ta blanket wafer: 200 mm diameter wafer coated with 1 μm thick tantalum film
  Patterned wafer: CMP 854 patterned wafer (from Sematech)
  Polishing pad/wafer rotational speed: 95/120 rpm
  Turntable temperature: 20° C.

Method of Evaluation:

(1) CMP Rate

Thicknesses of the metal film of the Cu and the Ta blanket wafers were obtained from the electrical resistance values measured before and after CMP. Measurements were made at 49 points to obtain an average polishing rate.

(2) Dishing

The patterned wafer was polished until excess copper on the field regions was completely cleared and then overpolished for 50% extra time over that required to clear the copper from the field regions. The dishing in a line/space area (100 μm line/100 μm space) was measured with a contact probe level difference meter.

The Cu CMP rate, the dishing, and the Cu/Ta CMP rate ratio (indicative of Cu selectivity over Ta) are shown in Table 3 below.

Examples 2 to 28 and Comparative Examples 1 to 3

Polishing compositions were prepared and tested in the same manner as in Example 1, except for using the compounds shown in Table 3. The results of the test are shown in Table 3.

TABLE 3

| | Organic Acid | Aromatic Compound | Cu CMP Rate (nm/min) | Dishing (nm) | Cu/Ta CMP Rate Ratio |
|---|---|---|---|---|---|
| Example 1 | A-1 | benzo-triazole | 530 | 93 | 450 |
| Example 2 | A-3 | benzo-triazole | 570 | 76 | 250 |
| Example 3 | A-5 | benzo-triazole | 500 | 55 | 230 |
| Example 4 | A-9 | benzo-triazole | 420 | 46 | 390 |
| Example 5 | A-4 | benzo-triazole | 630 | 62 | 530 |
| Example 6 | A-11 | benzo-triazole | 740 | 53 | 300 |
| Example 7 | A-14 | benzo-triazole | 610 | 72 | 470 |
| Example 8 | A-19 | benzo-triazole | 440 | 57 | 670 |
| Example 9 | A-20 | benzo-triazole | 450 | 42 | 510 |
| Example 10 | B-1 | benzo-triazole | 580 | 69 | 180 |
| Example 11 | B-2 | benzo-triazole | 630 | 60 | 220 |
| Example 12 | B-3 | benzo-triazole | 670 | 75 | 240 |
| Example 13 | B-4 | benzo-triazole | 600 | 70 | 290 |
| Example 14 | B-9 | benzo-triazole | 410 | 54 | 150 |
| Example 15 | A-19 B-1 | benzo-triazole | 550 | 64 | 360 |
| Example 16 | B-3 β-alanine | benzo-triazole | 660 | 67 | 430 |
| Example 17 | A-14 B-2 | benzo-triazole | 650 | 57 | 490 |
| Example 18 | A-1 | none | 710 | 150 | 520 |
| Example 19 | A-5 | tetrazole | 410 | 48 | 220 |
| Example 20 | A-2 | " | 630 | 82 | 390 |
| Example 21 | A-20 | " | 580 | 38 | 460 |
| Example 22 | B-3 | " | 770 | 65 | 130 |
| Example 23 | A-5 B-3 | " | 720 | 58 | 200 |
| Example 24 | A-14 | amino-tetrazole | 740 | 65 | 260 |
| Example 25 | B-2 | amino-tetrazole | 850 | 63 | 160 |
| Example 26 | B-3 glycine | amino-tetrazole | 960 | 76 | 490 |
| Example 27 | A-4 imino-diacetic acid | amino-tetrazole | 860 | 53 | 190 |
| Example 28 | B-1 | anthranylic acid | 690 | 71 | 270 |
| Compara. Example 1 | glycine | benzo-triazole | 650 | 180 | 880 |
| Compara. Example 2 | iminodi-acetic acid | benzo-triazole | 690 | 110 | 120 |
| Compara. Example 3 | α-alanine | benzo-triazole | 430 | 95 | 550 |

The results in Table 3 prove that the polishing compositions containing the compound (1) or the compound (2) are superior to those containing an α-amino acid, e.g., glycine, or iminodiacetic acid in polishing rate and dishing. It is also seen that a combined use of the compound (1) and the compound (2) brings about improved Cu/Ta selectivity.

This application is based con Japanese Patent application JP 2004-342394, filed Nov. 26, 2004, and Japanese Patent application JP 2005-71153, filed Mar. 14, 2005, the entire contents of which are hereby incorporated by reference, the same as if set forth at length.

What is claimed is:

1. A metal polishing composition comprising a compound represented by formula (1):

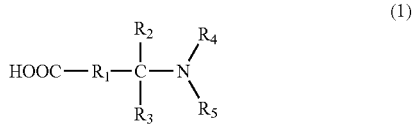

(1)

wherein $R_1$ represents a single bond, an alkylene group or a phenylene group; $R_2$ and $R_3$ each independently represent a hydrogen atom, a halogen atom, a carboxyl group, an alkyl group, a cycloalkyl group, an alkenyl group, an alkynyl group or an aryl group; and $R_4$ and $R_5$ each independently represent a hydrogen atom, a halogen atom, a carboxyl group, an alkyl group or an acyl group provided that when $R_1$ represents a single bond, $R_4$ and $R_5$ do not simultaneously represent a hydrogen atom;

and a compound represented by formula (2):

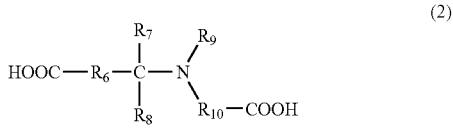

(2)

wherein $R_6$ represents a single bond, an alkylene group or a phenylene group; $R_7$ and $R_8$ each independently represent a hydrogen atom, a halogen atom, a carboxyl group, an alkyl group, a cycloalkyl group, an alkenyl group, an alkynyl group or an aryl group; $R_9$ represents a hydrogen atom, a halogen atom, a carboxyl group or an alkyl group; $R_{10}$ represents an alkylene group; with proviso that, when $R_{10}$ represents a methylene group, formula (2) satisfies at least one of a condition that $R_6$ is not a single bond and a condition that $R_9$ is not a hydrogen atom, and an oxidizing agent.

2. The metal polishing composition according to claim 1, further comprising abrasive grains.

3. The metal polishing composition according to claim 2, wherein the abrasive grains are colloidal silica.

4. The metal polishing composition according to claim 1, further comprising a compound having an aromatic ring.

5. The metal polishing composition according to claim 4, wherein the compound having an aromatic ring is a compound selected from a compound represented by formula (I):

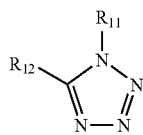

(I)

wherein $R_{11}$ and $R_{12}$ each independently represent a hydrogen atom or a substituent, or $R_{11}$ and $R_{12}$ are connected to each other to form a ring; when $R_{11}$ and $R_{12}$ both represent a hydrogen atom, the compound of formula (I) includes an enantiomer thereof, and a compound represented by formula (II):

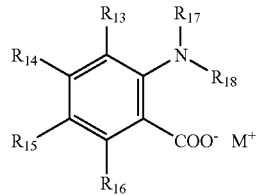

(II)

wherein $R_{13}$, $R_{14}$, $R_{15}$, $R_{16}$, $R_{17}$, and $R_{18}$ each independently represent a hydrogen atom or a substituent; any adjacent two of $R_{13}$, $R_{14}$, $R_{15}$, and $R_{16}$ may be connected to each other to form a ring; and $M^+$ represents a cation.

6. A chemical mechanical polishing method comprising bringing the metal polishing composition according to claim 1 into contact with a surface to be polished and providing a relative movement between the surface to be polished and a polishing surface.

* * * * *